United States Patent [19]

Yamamoto et al.

[11] Patent Number: 5,763,926
[45] Date of Patent: Jun. 9, 1998

[54] SEMICONDUCTOR DEVICE HAVING A BI-CMOS TRANSISTOR INCLUDING AN N-CHANNEL MOS TRANSISTOR

[75] Inventors: Fumitoshi Yamamoto; Tomohide Terashima, both of Hyogo, Japan

[73] Assignee: Mitsubishi Denki Kabushiki Kaisha, Tokyo, Japan

[21] Appl. No.: 742,120

[22] Filed: Oct. 31, 1996

Related U.S. Application Data

[63] Continuation of Ser. No. 551,393, Nov. 1, 1995, abandoned, which is a continuation of Ser. No. 333,990, Nov. 2, 1994, abandoned.

[30] Foreign Application Priority Data

Nov. 5, 1993 [JP] Japan ............... 5-276685

[51] Int. Cl.⁶ .................. H01L 29/76; H01L 29/94; H01L 31/062; H01L 31/113
[52] U.S. Cl. ............... 257/401; 257/372; 257/373; 257/394; 257/409
[58] Field of Search .................. 257/370, 372, 257/373, 394, 401, 409

[56] References Cited

U.S. PATENT DOCUMENTS

| | | | |
|---|---|---|---|
| 4,035,826 | 7/1977 | Morton et al. | 257/369 |
| 4,614,959 | 9/1986 | Nakagawa | 257/409 |
| 5,274,259 | 12/1993 | Grabowski et al. | 257/409 |
| 5,319,236 | 6/1994 | Fujihira | 257/409 |

FOREIGN PATENT DOCUMENTS

| | | | |
|---|---|---|---|
| 3414772C2 | 10/1987 | Germany | 257/369 |
| 54-22781 | 2/1979 | Japan | 257/401 |
| 56-88363 | 7/1981 | Japan | 257/401 |
| 64-77157 | 3/1989 | Japan | 257/409 |

OTHER PUBLICATIONS

IEEE Electron Device Letters, "Failure in CMOS Circuits Induced by Hot Carriers in Multi–Gate Transistors", vol. 9, No. 11, 1989, pp. 564–566.

*Primary Examiner*—Steven H. Loke
*Attorney, Agent, or Firm*—McDermott, Will & Emery

[57] ABSTRACT

In a semiconductor device and a method of manufacturing the same according to the invention, a p-type diffusion region for electrically connecting a back gate region and an electrode layer together is formed at a source region. Thereby, both of source region and p-type diffusion region are electrically connected to the electrode layer, so that the source region and the back gate region are maintained at the same potential. As a result, it is possible to provide the semiconductor device and the method of manufacturing the same which can suppress operation of a parasitic bipolar transistor formed in the semiconductor device even if a gate electrode has a large width.

3 Claims, 17 Drawing Sheets

$I_D$-$V_D$ CHARACTERISTICS

SEMICONDUCTOR DEVICE HAVING A BI-CMOS TRANSISTOR INCLUDING AN N-CHANNEL MOS TRANSISTOR

This application is a continuation of application Ser. No. 08/551,393 filed Nov. 1, 1995, now abandoned, which is a continuation of application Ser. No. 08/333,990, filed Nov. 2, 1994, now abandoned.

BACKGROUND OF THE INVENTION

1. Field of the Invention

The present invention relates to a semiconductor device and a method of manufacturing the same, and in particular to a semiconductor device, in which a Bi-CMOS transistor includes an n-channel MOS transistor having an improved structure, as well as a method of manufacturing the same.

2. Description of the Background Art

In recent years, it has been attempted to increase a scale of VLSIs such as memories and processors. For complying with the demand for increase of the scale, CMOS transistors which can be highly integrated and can operate with a low power consumption are now moving into the mainstream. However, demand for high-speed operation of the transistors cannot be sufficiently met at the present time, although the operation speed of MOS transistors has been increased to some extent owing to the development of miniaturizing technology. In general, bipolar transistors such as an ECL are the mainstream in the field of the high-speed transistors. However, the element power consumption of the bipolar transistor is extremely large, which remarkably restricts the high integration or density. In view of the aforementioned background, the Bi-CMOS transistors, which can have the feature of the CMOS transistor, i.e., high integration and lower power consumption as well as the feature of the bipolar transistor, i.e., high-speed operation, have attracted the attention as the device enabling a high-speed operation with a low power consumption.

Then, a structure of the conventional Bi-CMOS transistor will be described below with reference to FIG. 11. In a Bi-CMOS transistor 500, n-type epitaxial layers 1 are formed on a p-type semiconductor substrate 10, and n$^+$-buried layers 11 are located between p-type semiconductor substrate 10 and n-type epitaxial layers 1. On the surfaces of n-type epitaxial layers 1, there are formed a bipolar transistor formation region 100 and a CMOS transistor formation region 200 which are isolated from each other by a p$^+$-type diffusion layer 12. Further, at each CMOS transistor formation region 200, there are formed a p-channel MOS transistor formation region 210 and an n-channel MOS transistor formation region 220.

At bipolar transistor formation region 100, there is formed an npn bipolar transistor 50 which includes a p-type base region 5a, an n-type collector region 6a and an n-type emitter region 6b. At p-channel MOS transistor formation region 210, there is formed a p-channel MOS transistor 52 which includes a gate electrode 4, a p-type drain region 5b and a p-type source region 5c. At n-channel MOS transistor formation region 220, there is formed n-channel MOS transistors 54 which includes gate electrodes 4, n-type drain regions 6c and n-type source regions 6d.

Drain regions 6c and source regions 6d at n-channel MOS transistor formation region 220 are surrounded by a p-type back gate region 2. Further, electrode layers 9 are formed at base region 5a, emitter region 6b, collector region 6a, drain regions 5b and 6c, and source regions 5c and 6d. The surface of semiconductor substrate 10 is covered with a silicon oxide film 7.

Then, a planar pattern of n-channel MOS transistor formation region 220 will be described below with reference to FIG. 12. Gate electrodes 4 are disposed parallel to each other with a predetermined space therebetween. Drain contact regions 8b and source contact regions 8c are formed alternately to each other between gate electrodes 4. Electrode layers 9 are formed at these contact regions. n-channel MOS transistor formation region 220 is surrounded by a field oxide film 3. Each gate electrode 4 is connected to a gate contact 8a via an aluminum interconnection 9b. An aluminum interconnection 9c is connected to back gate region 2 via back gate contact 8d.

A method of manufacturing the Bi-CMOS transistor having the above structure will be described below with reference to FIGS. 13 to 15. Referring first to FIG. 13, a thin oxide film is formed on p-type semiconductor substrate 10, and then is patterned into a predetermined configuration by photolithography. Using this oxide film as a mask, n-type impurity is introduced into the surface of semiconductor substrate 10 to form n$^+$-buried layers 11. After removing the oxide film, an epitaxial growth method is performed on semiconductor substrate 10 to form n-type epitaxial layer 1 from 4.0 to 15.0 μm in thickness.

Similarly to the aforementioned step, an oxide film having a predetermined pattern is formed on epitaxial layer 1. Using this oxide film as a mask, introduction of impurity such as boron is performed, and then heat treatment is performed to form p$^+$-type diffusion layers 12. p-type diffusion layers 12 are continuous to substrate 10. Thereafter, p$^+$-type back gate region 2 is formed by the steps similar to the aforementioned steps.

Referring to FIG. 14, an LOCOS oxidization method is performed to form silicon oxide films 3 at predetermined regions on epitaxial growth layers 1. Thereafter, polysilicon is deposited, and is patterned into a predetermined configuration by the photolithography to form gate electrodes 4.

Referring to FIG. 15, photolithography is performed to provide regions 5a, 5b and 5c formed from p-type impurity diffusion region, i.e., base region 5a, and drain region 5b and source region 5c of p-channel MOS transistor, as well as regions 6a, 6b, 6c and 6d formed from n-type impurity diffusion region, i.e., collector region 6a, emitter region 6b, and drain regions 6c and source regions 6d of n-channel MOS transistors. Then, silicon oxide film 7 is deposited on the uppermost surface of semiconductor substrate 10. Thereafter, photolithography is performed to form contact holes communicated with base region 5a, collector region 6a, emitter region 6b, drain regions 5b and 6c, and source regions 5c and 6d. Then, insulating layers 9, e.g., made of aluminum are formed. In this manner, Bi-CMOS transistor 500 shown in FIG. 11 is completed.

The following problem, however, exists in the prior art described above. First, referring to FIG. 16, source region 6d and back gate region 2 are set to 0 (V) (GND), 24 (V) is applied to drain region 6c, and a voltage which successively changes from 0 (V) to 24 (V) is applied to gate electrode 4. In this operation, a current flowing from source region 6d to drain region 6c, which will be referred to as a "channel current e$^-$" is gradually increased at a strong electric field portion 14 formed near drain region 6c. When the voltage of 24 (V) is applied to drain region 6c, a current flowing through drain region 6c, which will be referred to as a "drain current $I_D$", exhibits a saturated characteristic as shown in FIGS. 17 and 18, wherein $V_D$ indicates a drain voltage and $I_D$ indicates a drain current.

The reason of the above phenomenon or state is that channel current e$^-$ is increased at strong electric field portion 14 near drain region 6c, so that the amount of holes h⁺ flowing into back gate region 2 remarkably increases, resulting in increase of the current flowing through back gate region 2, which will be referred to as a "back gate current". Therefore, voltage drop occurs at back gate region 2, so that a forward bias is applied across source region 6d and back gate region 2.

Thus, the above phenomenon or state is due to the operation of a parasitic npn bipolar transistor which is formed of drain region 6c of n-channel MOS transistor, back gate region 2 and source region 6d of n-channel MOS transistor. As can be seen from comparison of drain current ($I_D$) and back gate current ($I_{BC}$) in the cases where the gate electrode has a width of 7 μm as shown in FIGS. 17 and 18 and the gate electrode has a width of 500 μm as shown in FIGS. 19 and 20, the amount of holes h⁺ flowing into back gate region 2 increases as the width (W) of gate electrode 4 increases, so that the voltage drop at back gate electrode 2 occurs further remarkably. Therefore, the parasitic bipolar transistor unavoidably operates even if the voltage applied to source region 6d and drain region 6c is small.

SUMMARY OF THE INVENTION

The present invention has been developed to overcome the above disadvantages, and has an object to provide a semiconductor device in which operation of a parasitic bipolar transistor formed in the semiconductor device can be prevented even if a gate width is long, as well as a method of manufacturing the same.

In order to achieve the above object, a semiconductor device according to the invention includes a semiconductor region of a first conductivity type having a main surface, a conductive layer formed on the main surface with an insulating film therebetween and having a predetermined length and a predetermined width, a pair of first and second impurity regions of a second conductivity type formed at the main surface of the semiconductor region and having a predetermined depth, an electrode layer electrically connected to the first impurity region, and a connection layer of the first conductivity type formed at the first impurity region for electrically connecting the semiconductor region and the electrode layer together, this connection layer being formed to a depth greater than the predetermined depth of the first and second impurity regions.

In order to achieve the above object, a method of manufacturing a semiconductor device according to the invention includes the following steps.

An epitaxial layer of a second conductivity type is formed on a semiconductor substrate of a first conductivity type by an epitaxial growth method. Then, impurity of the first conductivity type is introduced into a predetermined region of the epitaxial layer to form a semiconductor region of the first conductivity type.

A conductive layer having a predetermined length and a predetermined width is formed on a main surface of the semiconductor region with an insulating film therebetween. Thereafter, using the conductive layer as a mask, impurity of a second conductivity type is introduced into the semiconductor region to form first and second impurity regions which are located at longitudinally opposite sides of the conductive layer.

According to the semiconductor device and the method of manufacturing the same described above, both of the first impurity region and the semiconductor region are electrically connected to the electrode layer, so that the first impurity region and the semiconductor region are maintained at the same potential. Therefore, it is possible to suppress flow of a hole current into the semiconductor region and thus to prevent voltage drop at the semiconductor region. As a result, a potential difference between the second impurity region and the semiconductor region can be small.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

A first preferred embodiment of the invention will be described below. First, a structure of a Bi-CMOS transistor 300 of the first embodiment will be described below with reference to FIGS. 1 and 2.

Figure 1:
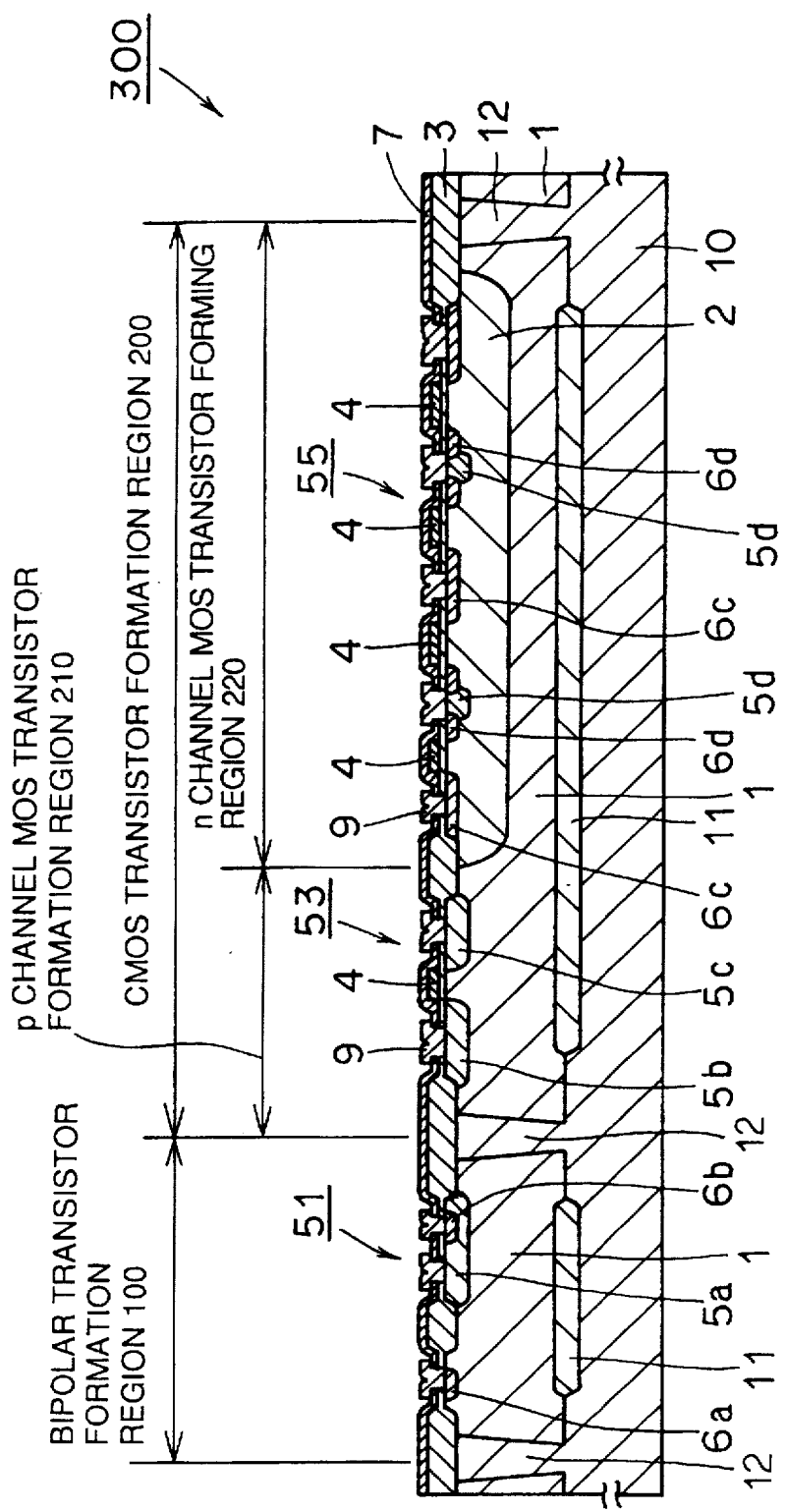
FIG. 1 is a cross section showing a structure of a semiconductor device of a first embodiment of the invention.

Referring first to FIG. 1, Bi-CMOS transistor 300 includes n-type epitaxial layers 1 formed on a p-type semiconductor substrate 10, and also includes n⁺-buried layers 11 located between p-type semiconductor substrate 10 and n-type epitaxial layers 1.

On the surfaces of n-type epitaxial layers 1, there are formed a bipolar transistor formation region 100 and a CMOS transistor formation region 200 which are isolated from each other by p⁺-type diffusion layer 12. Further, at CMOS, transistor formation region 200, there are formed a p-channel MOS transistor formation region 210 and an n-channel MOS transistor formation region 220.

At bipolar transistor formation region 100, there is formed an npn bipolar transistor 51 which includes a p-type base region 5a, an n-type collector region 6a and an n-type emitter region 6b. At p-channel MOS transistor formation region 210, there is formed a p-channel MOS transistor 53 which includes a gate electrode 4, a p-type drain region 5b and a p-type source region 5c. At n-channel MOS transistor formation region 220, there is formed an n-channel MOS transistor 55 which includes gate electrode 4, n-type drain regions 6c and n-type source regions 6d. Drain regions 6c and source regions 6d of n-channel MOS transistor formation region 220 are surrounded by a p-type back gate region 2.

Further, electrode layers 9 are formed at base region 5a, emitter region 6b, collector region 6a, drain regions 5b and 6c, and source regions 5c and 6d. At each source region 6d, there is provided p⁺-type diffusion regions 5d for electrically connecting electrode layers 9 to back gate region 2. The surface of semiconductor substrate 10 is covered with a silicon oxide film 7.

Figure 2:
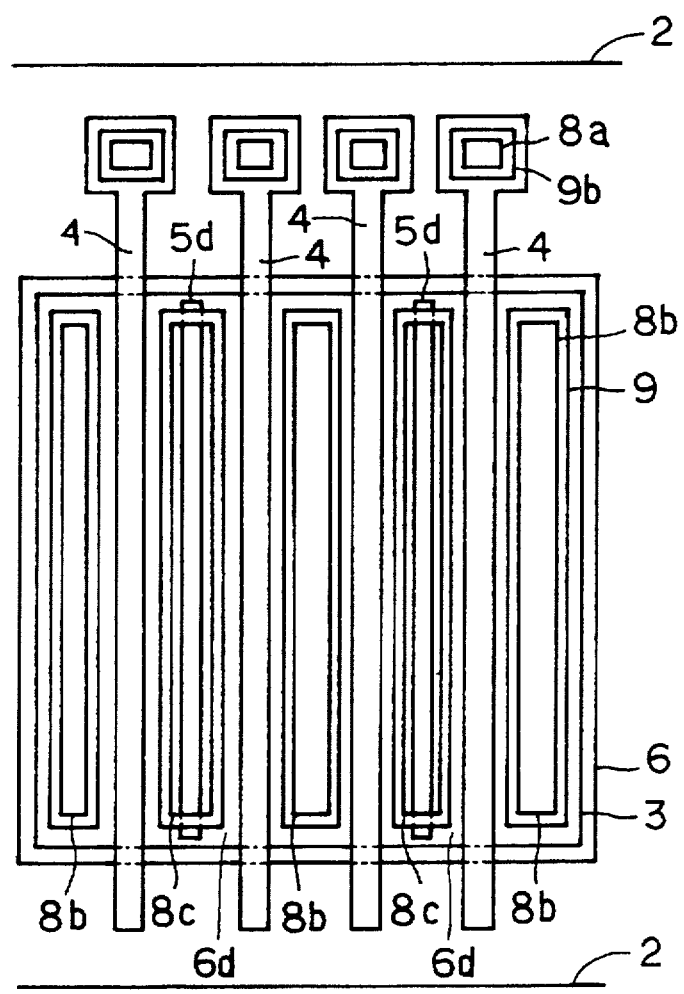
FIG. 2 is a plan showing an n-channel MOS transistor formation region shown in FIG. 1.

Then, a planar pattern of the n-channel MOS transistor will be described below with reference to FIG. 2. Gate electrodes 4 are disposed parallel to each other with a predetermined space therebetween. Drain contact regions 8b and source contact regions 8c are formed alternately to each other with gate electrodes 4 therebetween. Electrode layers 9 are formed at these contacts. n-channel MOS transistor formation region 220 is surrounded by a field oxide film 3. Each gate electrode 4 is connected to a gate contact 8a via an aluminum interconnection 9b. At each source region 6d, there is formed p⁺-type diffusion region 5d forming along the widthwise direction of gate electrode 4.

Operation of n-channel MOS transistor 55 of this embodiment will be described below with reference to FIG. 3. In this embodiment, p⁺-type diffusion region 5d is arranged at source region 6d for electrically connecting back gate region 2 and electrode layer 9 together. Thereby, both of back gate region 2 and source region 6d are electrically connected to electrode layer 9, so that back gate region 2 and source region 6d are maintained at the same potential. Therefore, it is possible to suppress the flow of hole current into back gate region 2 and prevent voltage drop at back gate region 2, so that the potential difference between source region 6d and back gate region 2 can be reduced.

Figure 4:
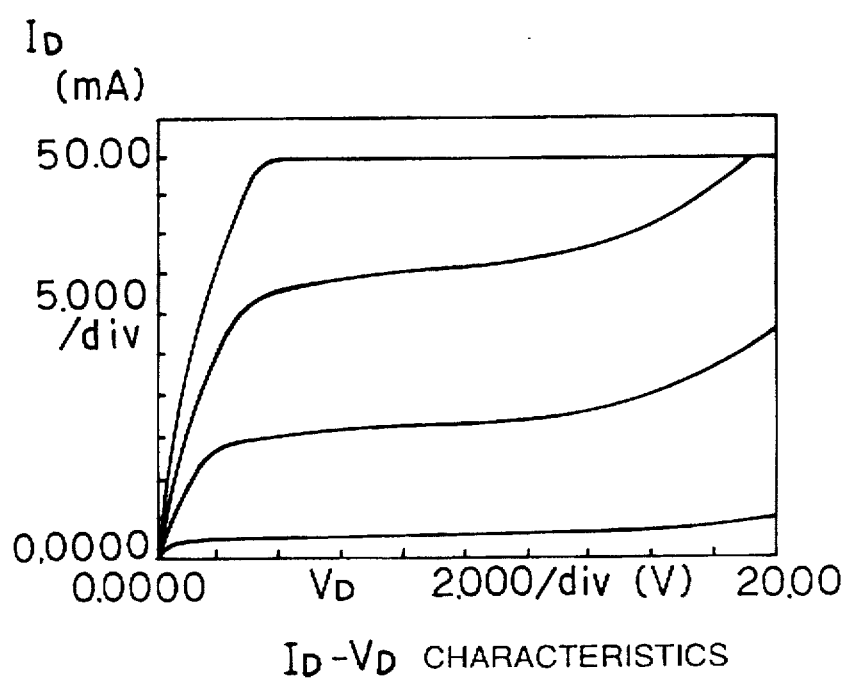
FIG. 4 is a diagram showing $I_D$-$V_D$ characteristics of the semiconductor device according to the invention.
Figure 19:
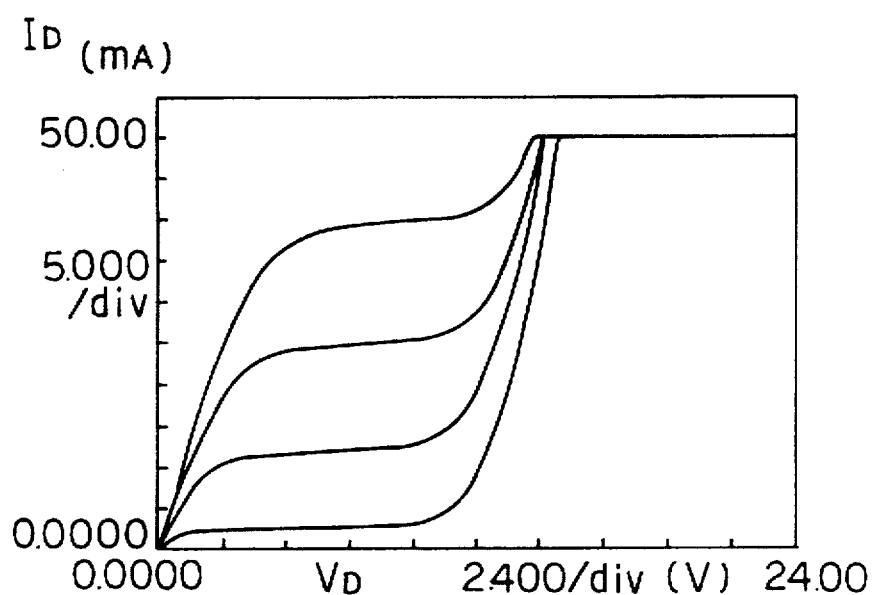
FIG. 19 shows $I_D$-$V_D$ characteristics in the case where a gate width is 500 μm in the prior art.
Figure 20:
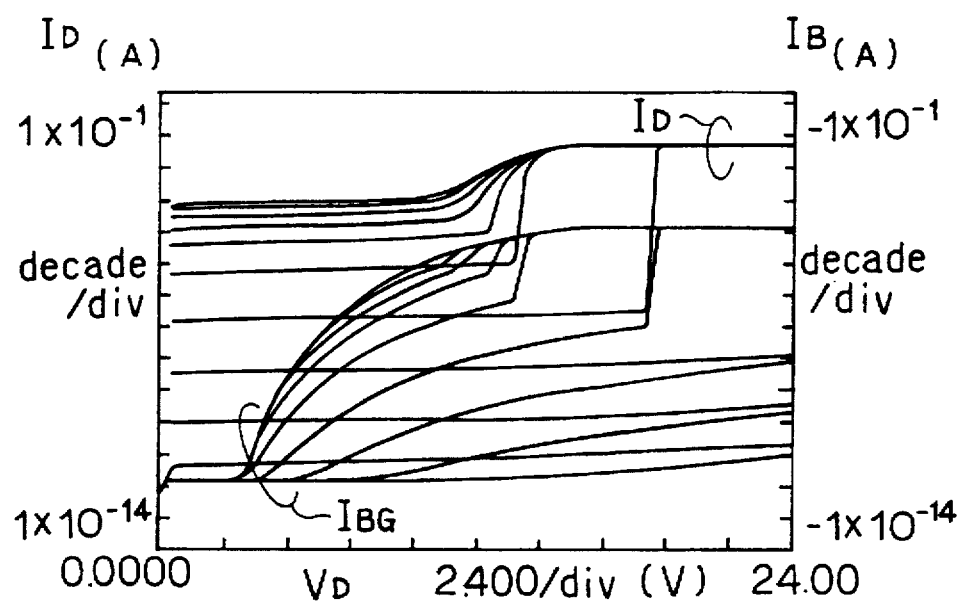
FIG. 20 shows $I_{BG}$ characteristics in the case where a gate width is 500 μm in the prior art.

As a result, it is possible to prevent operation of the parasitic bipolar transistor if drain voltage ($V_D$) is not larger than 20 (V) as shown in FIG. 4, in contrast to the prior art in which the parasitic transistor operates with drain voltage ($V_D$) of 12 (V) if gate electrode 4 has a width of 500 µm as shown in FIG. 19.

Figure 5:
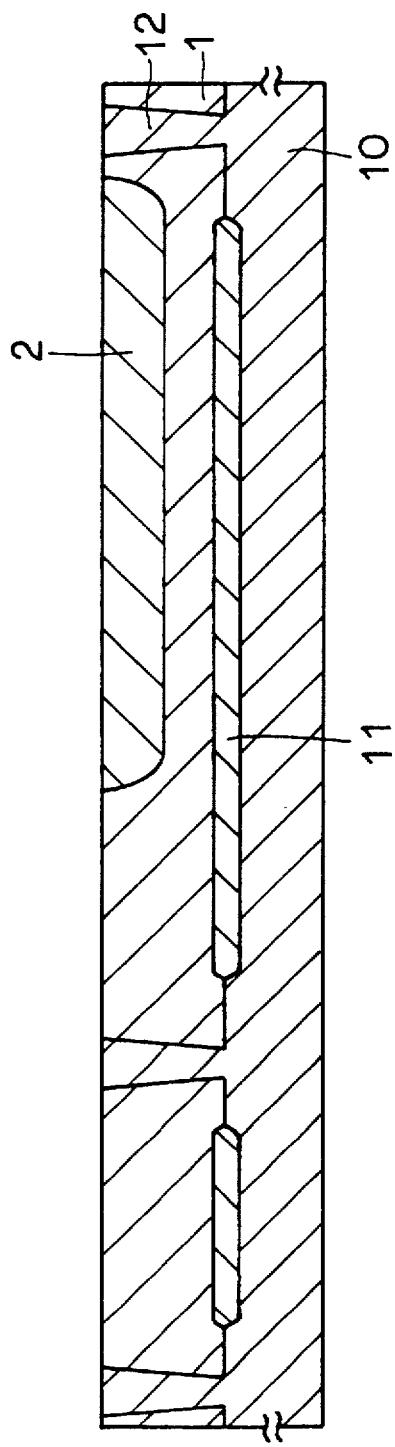
FIGS. 5 to 7 show 1st to 3rd steps in a method of manufacturing the semiconductor device according to the invention, respectively.

A method of manufacturing Bi-CMOS transistor 300 having the above structure will be described below with reference to FIGS. 5 to 7. Referring first to FIG. 5, a thin oxide film is formed on p-type semiconductor substrate 10, and then is patterned into a predetermined configuration by photolithography. Using this oxide film as a mask, n-type impurity is introduced into the surface of semiconductor substrate 10 to form n⁺-buried layers 11. After removing the oxide film, an epitaxial growth method is performed on semiconductor substrate 10 to form n-type epitaxial layer 1 of a thickness from 4.0 to 15.0 µm.

Similarly to the aforementioned step, an oxide film having a predetermined pattern is formed on epitaxial layer 1. Using this oxide film as a mask, introduction of impurity such as boron is performed with the implantation energy from 50 keV to 100 keV and the implantation rate from $1.0 \times 10^{12}$ to $6.0 \times 10^{12}$ cm⁻², and the heat treatment is performed to form p⁺-type diffusion layers 12 and p-type back gate region 2. p-type diffusion layers 12 thus formed are continuous to substrate 10.

Figure 6:
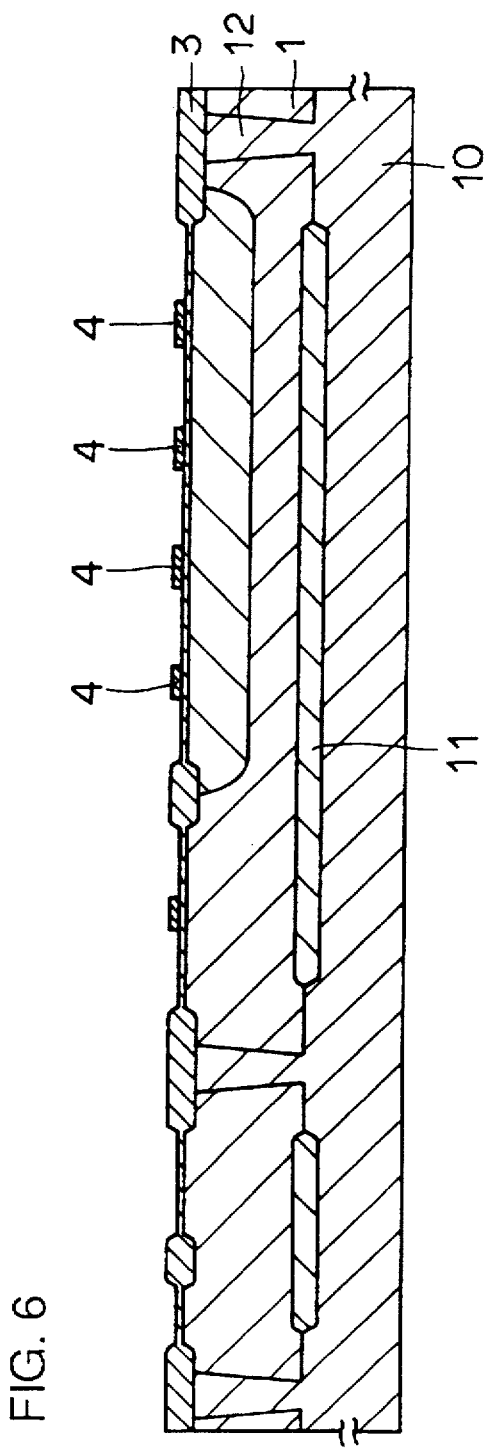

Referring to FIG. 6, an LOCOS oxidation method is performed to form silicon oxide films 3 having a thickness from 6000 to 16000 Å at predetermined regions on epitaxial growth layers 1. Thereafter, polysilicon is deposited to form a film from 3500 to 4500 Å in thickness, and is patterned into a predetermined configuration by the photolithography to form gate electrodes 4 on the gate oxide film having a thickness from 250 to 1200 Å.

Figure 7:
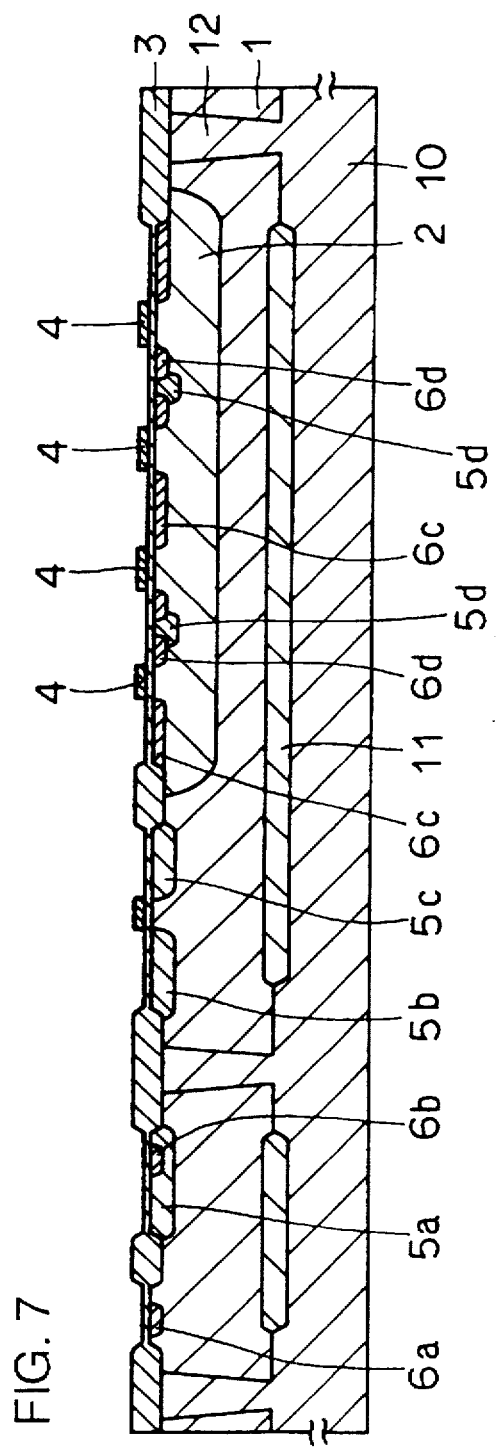

Referring to FIG. 7, photolithography is performed to provide a resist film having a predetermined pattern, and implantation of impurity such as boron is performed with the implantation rate from $1.0 \times 10^{14}$ to $3.0 \times 10^{14}$ cm⁻² and implantation energy of from 50 to 60 keV to form the regions 5a, 5b and 5c and 5d formed from p-type impurity diffusion region, i.e., base region 5a, and drain region 5b and source region 5c of p-channel MOS transistor, as well as p⁺-type diffusion region 5d. Further, photolithography is performed to provide a resist film having a predetermined pattern, and implantation of impurity such as arsenic is performed with the implantation rate from $4.0 \times 10^{15}$ to $6.0 \times 10^{15}$ cm⁻² and implantation energy of from 50 to 60 keV to form regions 6a, 6b, 6c and 6d formed from n-type impurity diffusion region, i.e., collector region 6a and emitter region 6b as well as drain regions 6c and source regions 6d of n-channel MOS transistors.

Figure 3:
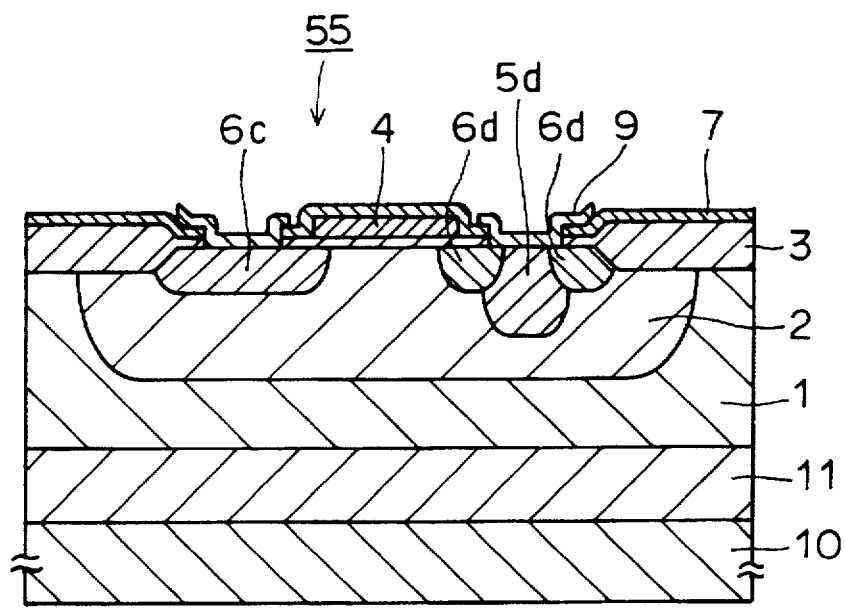
FIG. 3 is a cross section showing an operation of a semiconductor device according to the invention.

As clearly shown in FIGS. 1 and 7, and particularly in FIG. 3, the depth to which the p⁺-type diffusion region 5d is formed is greater than the depth to which the source region 6d is formed.

Then, silicon oxide film 7 is deposited on the surface of semiconductor substrate 10. Thereafter, photolithography is performed to form contact holes communicated with base region 5a, collector region 6a, emitter region 6b, drain regions 5b and 6c, source regions 5c and 6d, and insulating layers 9, e.g., made of aluminum are formed. In this manner, Bi-CMOS transistor 300 shown in FIG. 1 is completed.

Figure 8:
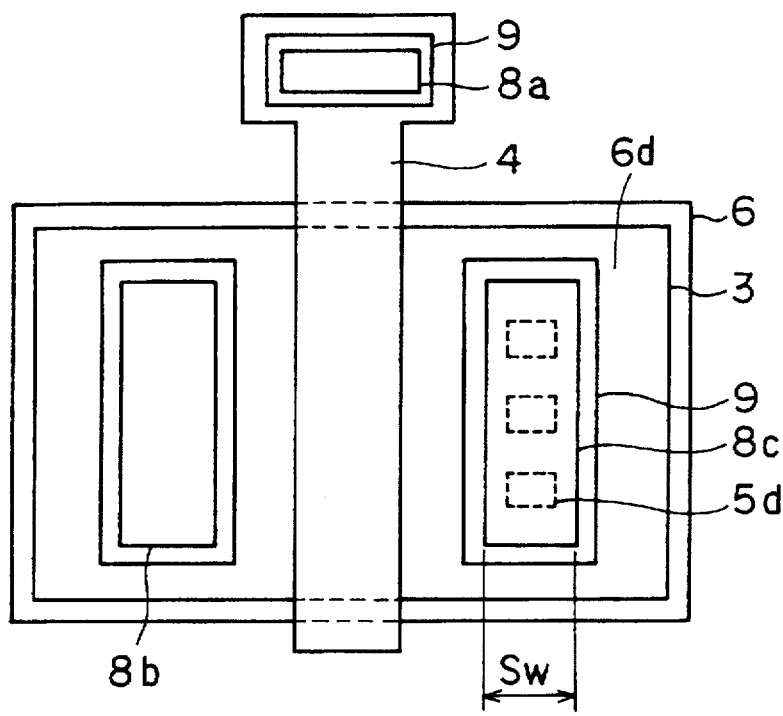
FIG. 8 is a schematic plan showing a structure of a semiconductor device of a second embodiment of the invention.

A second embodiment according to the invention will be described below with reference to FIG. 8. FIG. 8 is a plan corresponding to FIG. 2, and shows a planar pattern in the case where the gate electrode is one in number. According to this embodiment, p⁺-type diffusion region 5d formed at source region 6d does not continuously forming along widthwise direction of gate electrode 4 in contrast to the first embodiment, but include several portions separated from each other. Thus, source region 6d has a ladder-like pattern.

Owing to this structure, contact between source region 6d and p⁺-type diffusion region 5d is ensured even if a width ($S_W$) of source contact 8c is further reduced, so that a planar area of the semiconductor device can be reduced.

Figure 9:
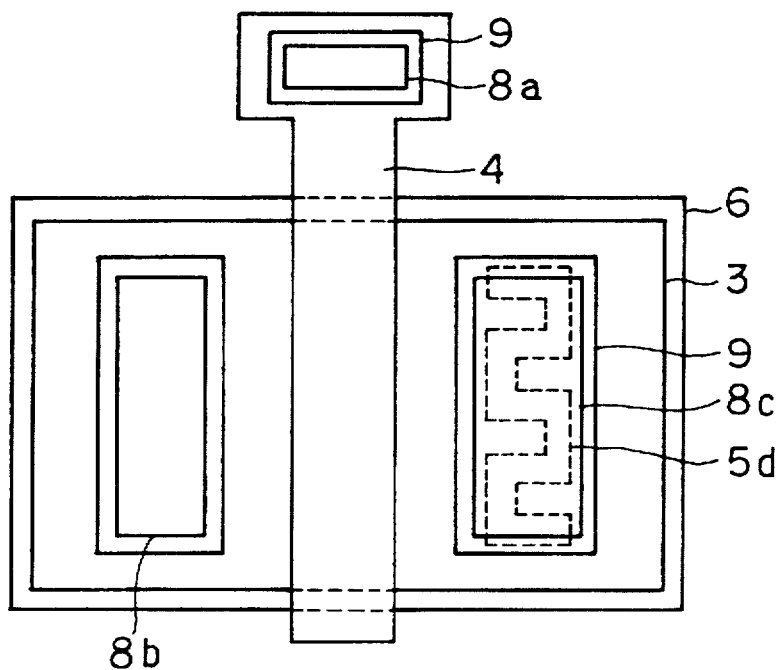
FIG. 9 is a schematic plan showing a structure of a third embodiment of the invention.

Then, a third embodiment according to the invention will be described below with reference to FIG. 9. FIG. 9 is a plan corresponding to FIG. 2, and shows a planar pattern in the case where gate electrode 4 is one in number. According to this embodiment, p⁺-type diffusion region 5d formed at source region 6d does not extend linearly in the direction of the width of gate electrode 4 in contrast to the first embodiment, but include a plurality of longitudinally and laterally extending portions which have a predetermined width and is arranged continuously to form a zigzag form.

Owing to this structure, even if a mask for forming source contact 8c is dislocated or shifted, p⁺-type diffusion region 5d is surely formed at source contact 8c, so that reliability of the semiconductor device can be improved.

Figure 10:
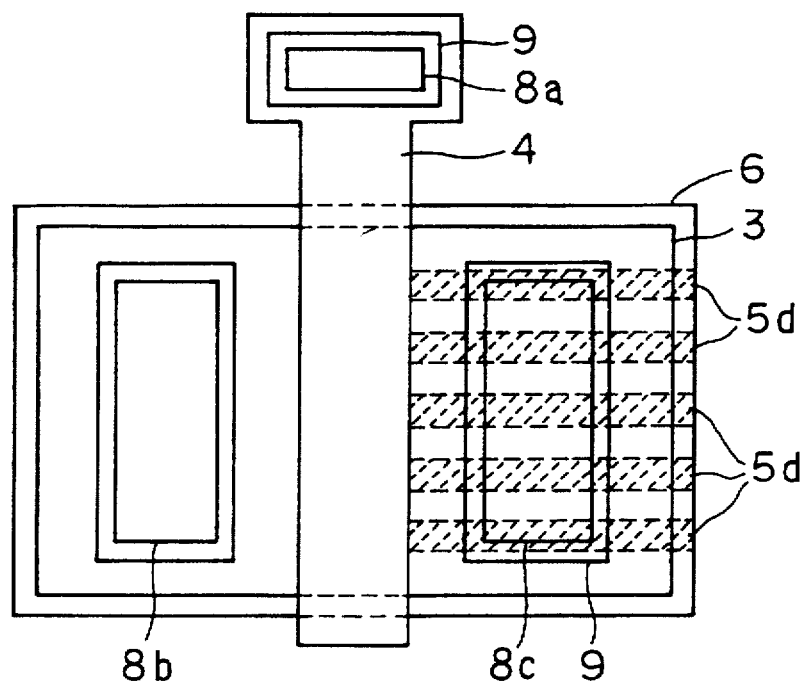
FIG. 10 is a schematic plan showing a structure of a fourth embodiment of the invention.
Figure 11:
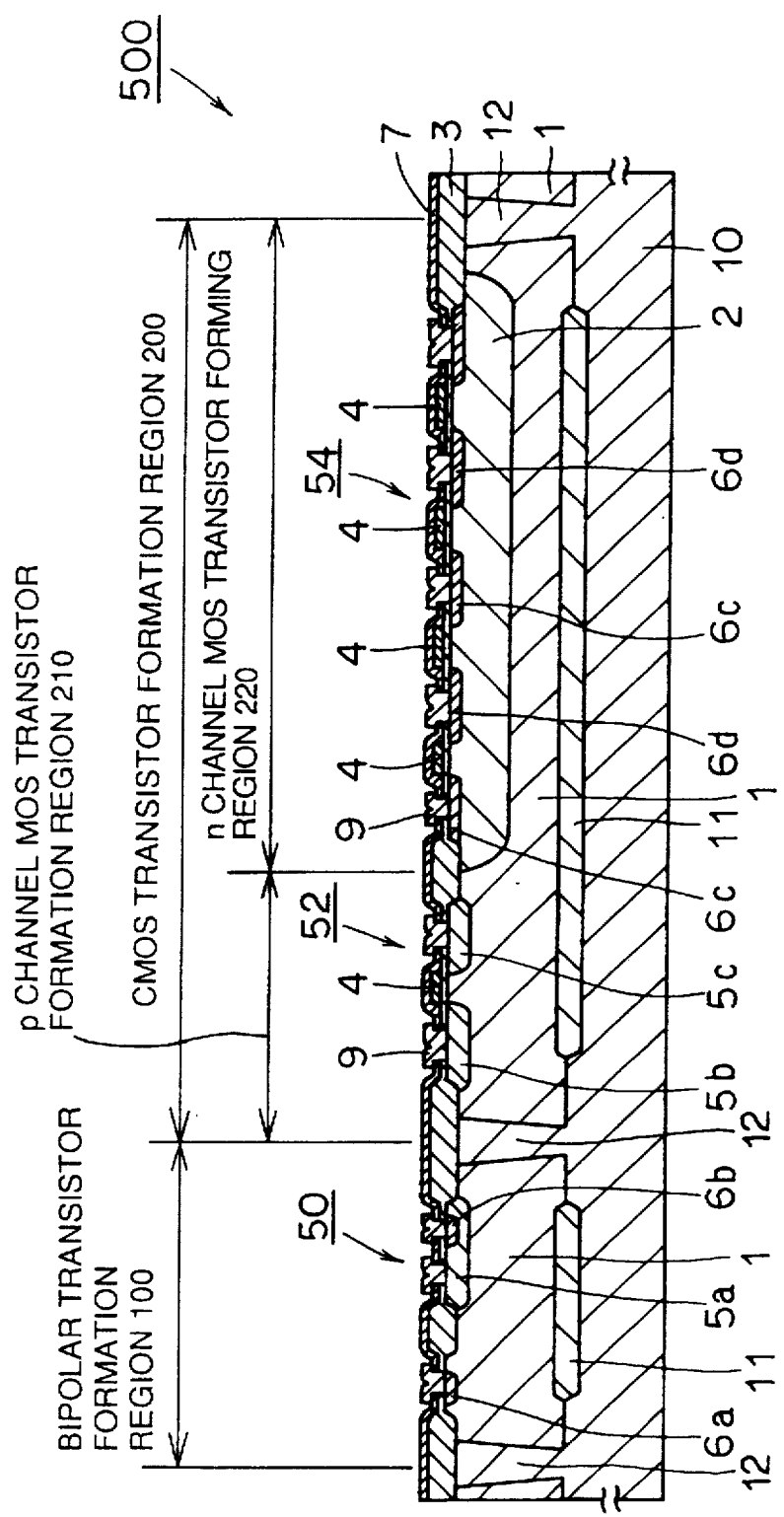
FIG. 11 is a cross section showing a structure of a semiconductor device in the prior art.
Figure 12:
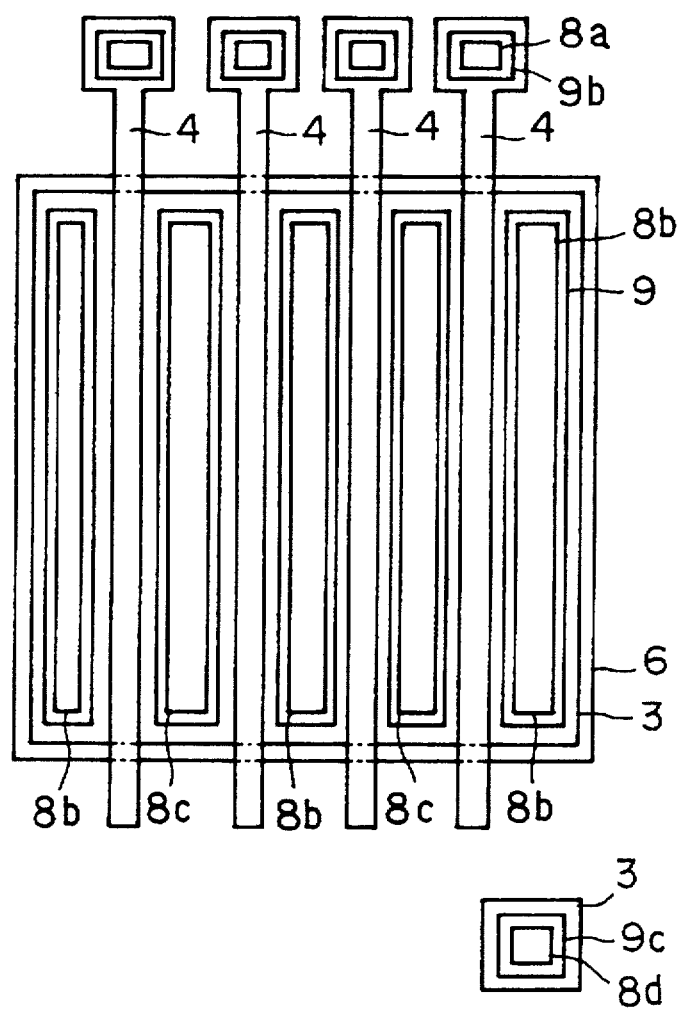
FIG. 12 is a plan showing an n-channel MOS transistor formation region shown in FIG. 11.
Figure 13:
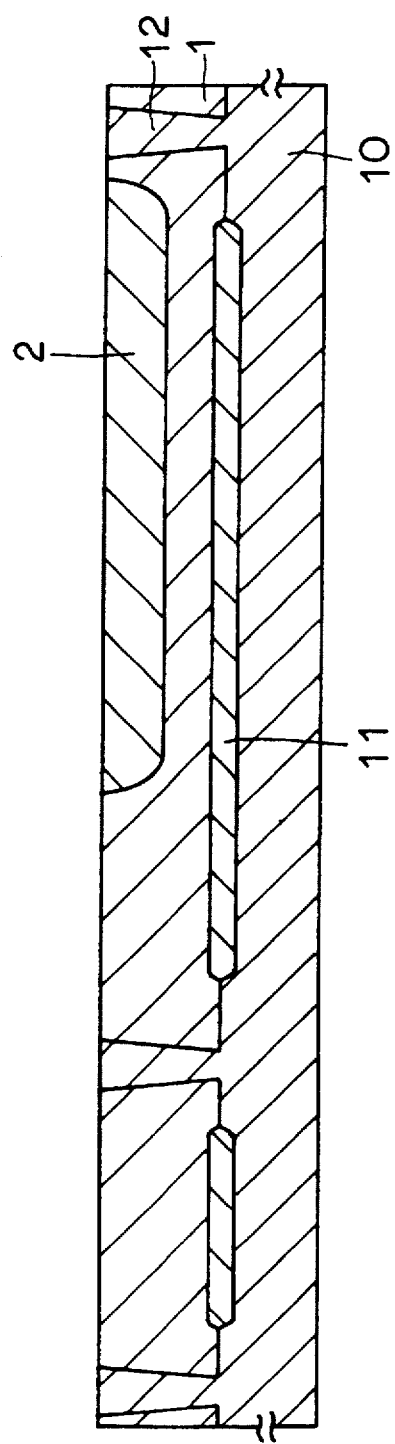
FIGS. 13 to 15 show 1st to 3rd steps in a method of manufacturing the semiconductor device in the prior art, respectively.
Figure 14:
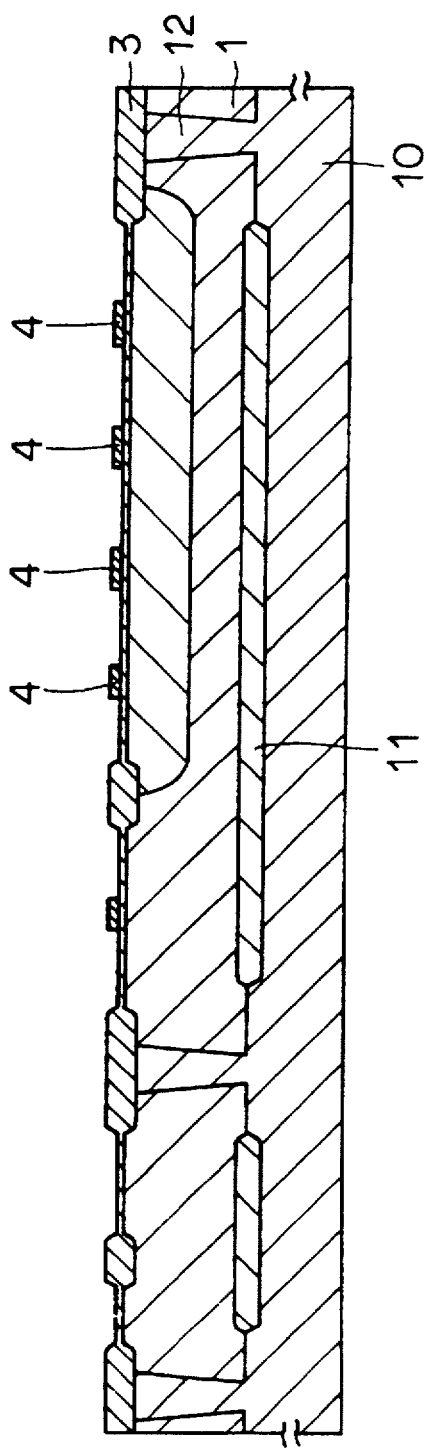
Figure 15:
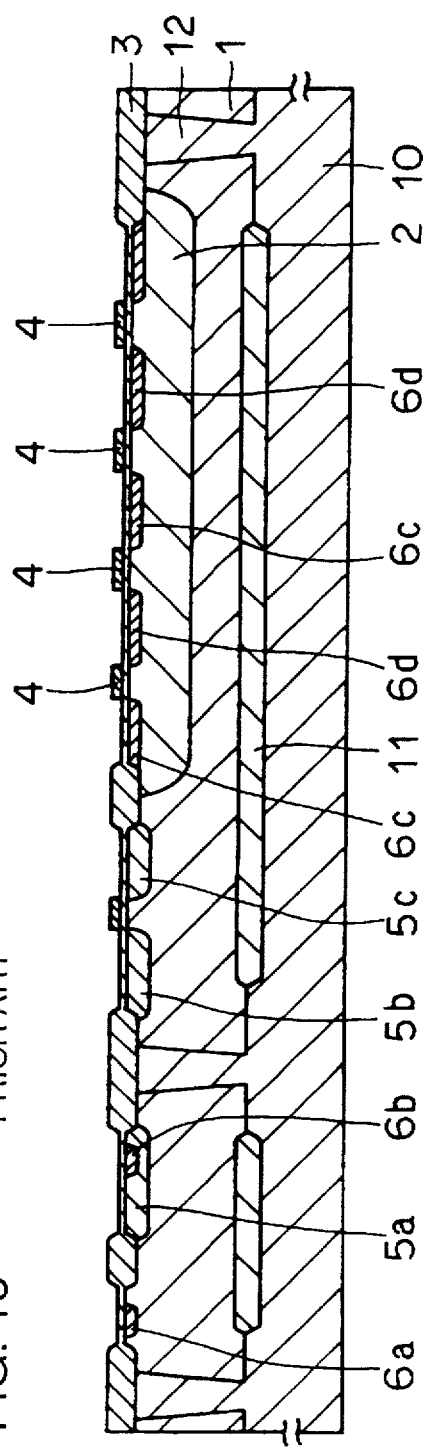
Figure 16:
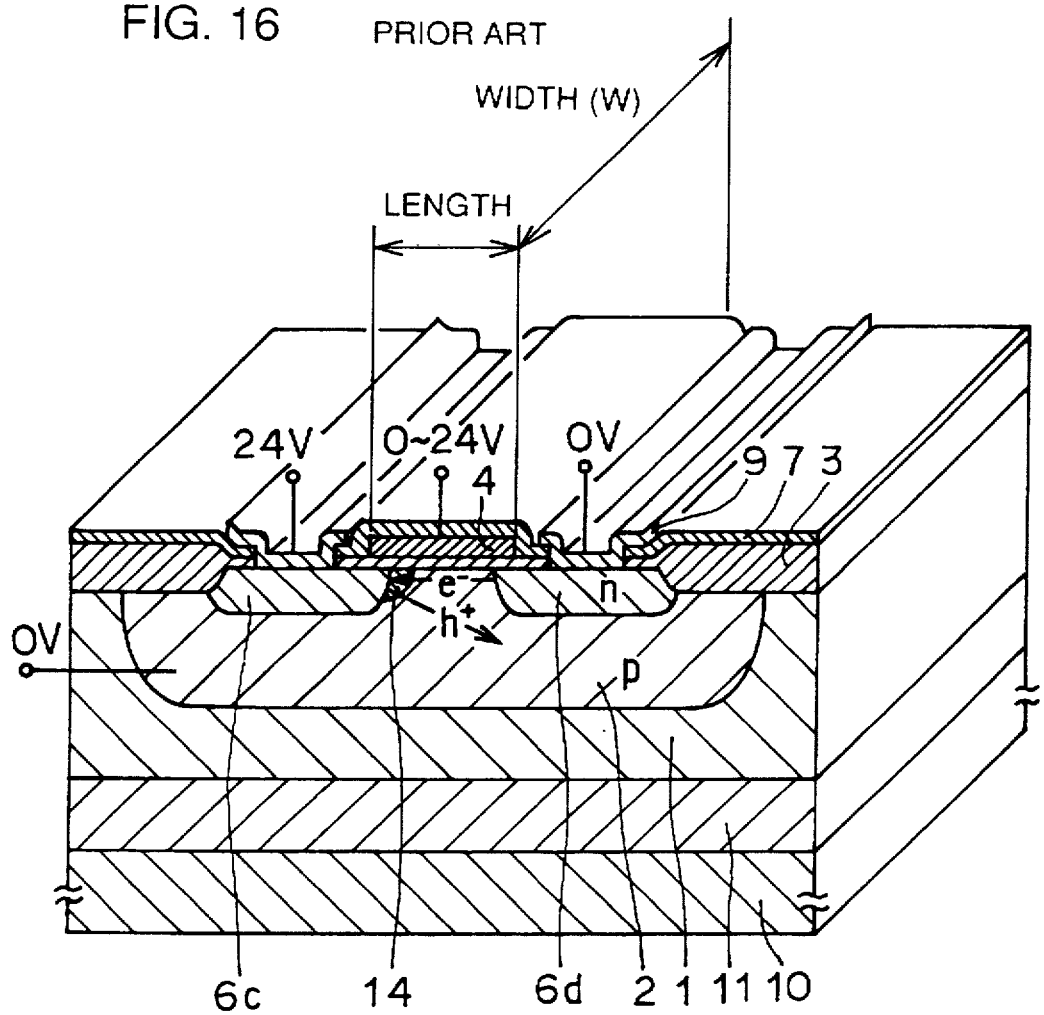
FIG. 16 is a cross section showing a structure of the semiconductor device in the prior art, and specifically showing a problem of the same.
Figure 17:
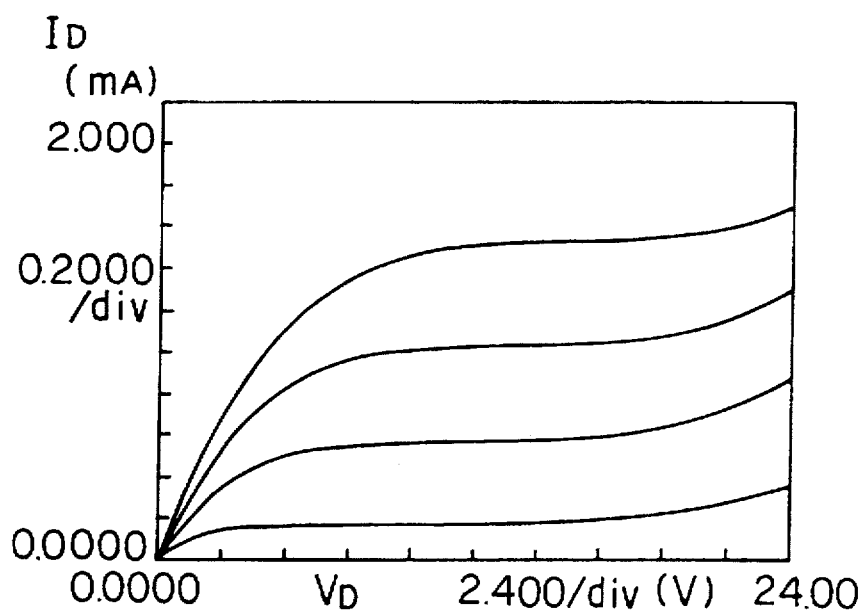
FIG. 17 shows $I_D$-$V_D$ characteristics in the case where a gate width is 7 μm in the prior art.
Figure 18:
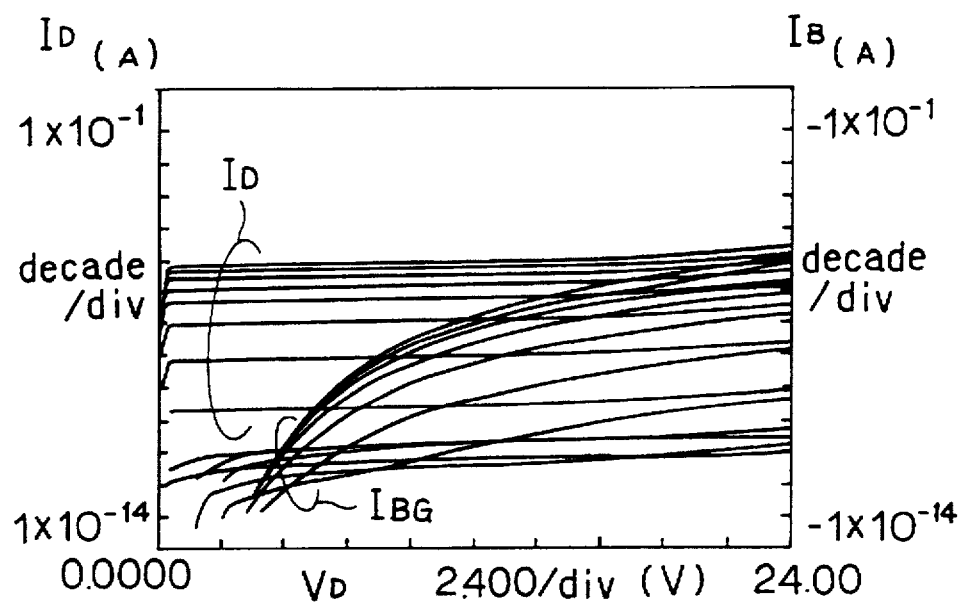
FIG. 18 shows $I_{BG}$ characteristics in the case where a gate width is 7 μm in the prior art.

A fourth embodiment according to this embodiment will be described below with reference to FIG. 10. FIG. 10 is a plan corresponding to FIG. 2, and shows a planar pattern in the case where the gate electrode is one in number. According to this embodiment, p⁺-type diffusion region 5d formed at source region 6d does not continuously extend widthwise of gate electrode 4 in contrast to the first embodiment, but include a plurality of portions which extend perpendicularly to gate electrode 4 and is spaced from each other by a predetermined distance.

Owing to this structure, source contact 8c can be formed at an arbitrary position without taking the disposition of p⁺-type diffusion region 5d into consideration. Further, even if a mask is dislocated at the step for forming the source contact hole, the contact to p⁺-type diffusion region 5d can be surely made, so that it is not necessary to take the dislocation of the mask for the source contact hole into consideration.

In the semiconductor device and the method of manufacturing the same according to the invention, the connection layer of the first conductivity type for electrically connecting the back gate region and the electrode layer together is formed at the source region. Thereby, both of the source region and the back gate region are electrically connected to the electrode layer, so that the back gate region and the source region are maintained at the same potential.

Therefore, it is possible to suppress the flow of the hole current into the back gate region, and thus to prevent the voltage drop at the back gate region. As a result, the potential difference between the drain region and the back gate region can be small, so that, even if the gate electrode has a large width, it is possible to suppress the operation of the parasitic bipolar transistor and thus to provide the semiconductor device having high reliability.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a semiconductor region of a first conductivity type having a main surface;

a gate electrode formed on said main surface with an insulating film therebetween and having a predetermined length and a predetermined width;

a pair of first and second impurity regions of a second conductivity type formed at said main surface of said semiconductor region to a predetermined depth, said first and second impurity regions extending along opposite sides of said gate electrode in the width direction, wherein the first impurity region is in contact with the semiconductor region of the first conductivity type;

an electrode layer electrically connected to said first impurity region at a surface contact region and spaced apart from a side surface of the gate electrode extending in the gate electrode width direction; and a connection layer of the first conductivity type formed within said first impurity region for electrically connecting said semiconductor region and said electrode layer, said connection layer being formed to a depth greater than said predetermined depth of said first and second impurity regions, wherein the distance between the side surface of the gate electrode and the connection layer in the gate electrode length direction changes abruptly at least once along the gate electrode width direction.

2. The semiconductor device according to claim 1, wherein:

said connection layer is arranged to form a continuous zigzag form.

3. The semiconductor device according to claim 1, wherein the connection layer meanders in the gate electrode width direction.

* * * * *